United States Patent [19]
Yamamoto et al.

[11] Patent Number: 4,984,244
[45] Date of Patent: Jan. 8, 1991

[54] SEMICONDUCTOR LASER DEVICE

[75] Inventors: Saburo Yamamoto; Taiji Morimoto, both of Nara; Kazuaki Sasaki, Osaka; Masaki Kondo, Nara; Takahiro Suyama, Tenri; Masafumi Kondo, Nara, all of Japan

[73] Assignee: Sharp Kabushiki Kaisha, Osaka, Japan

[21] Appl. No.: 406,903

[22] Filed: Sep. 13, 1989

[30] Foreign Application Priority Data

Sep. 14, 1988 [JP] Japan .................................. 63-230990

[51] Int. Cl.$^5$ ............................................... H01S 3/19
[52] U.S. Cl. ...................................... 372/461; 372/45; 437/129
[58] Field of Search ..................................... 372/43–46; 437/129, 130, 105

[56] References Cited

U.S. PATENT DOCUMENTS

| | | | |
|---|---|---|---|
| 4,566,171 | 1/1986 | Nelson et al. | 372/46 |
| 4,730,329 | 3/1988 | Yoshida et al. | 372/46 |
| 4,799,227 | 4/1989 | Kaneiwa et al. | 372/46 |
| 4,852,111 | 7/1989 | Hayakawa et al. | 372/46 |
| 4,868,838 | 9/1989 | Yamamoto | 372/46 |

FOREIGN PATENT DOCUMENTS

| | | | |
|---|---|---|---|
| 0048976 | 3/1984 | Japan | 372/46 |

OTHER PUBLICATIONS

Yamamoto et al., *Appl. Phys. Lett.* (Mar. 1, 1982), 40(5): 372-374.
European Search Report for EPC Application No. 89/309284.1, dated Jun. 22, 1990.
International Conference on Communications, Boston, Mass., Jun. 10th–14th, 1979, Conference Record, vol. 4, pp. 53.5.1–53.5.3, IEEE, New York.
Patent Abstracts of Japan, vol. 11, No. 374 (E-562), Dec. 5th, 1987.
11th IEEE International Semiconductor Laser Conference Digest, p. 144, Yamashita et al., Aug. 29-Sep. 1988.

*Primary Examiner*—Georgia Epps
*Attorney, Agent, or Firm*—Irell & Manella

[57] ABSTRACT

A semiconductor laser device is disclosed which comprises a semiconductor substrate, a striped mesa disposed on the substrate and having an active layer for laser oscillation, a current injection layer disposed on the striped mesa and having a width smaller than that of the striped mesa, and a burying layer disposed on both sides of the current injection layer so as to come into contact with the side walls of the current injection layer, the burying layer being capable of absorbing laser light produce in the active layer and of preventing current from flowing through the outside of the striped mesa.

4 Claims, 3 Drawing Sheets

FIG. 3
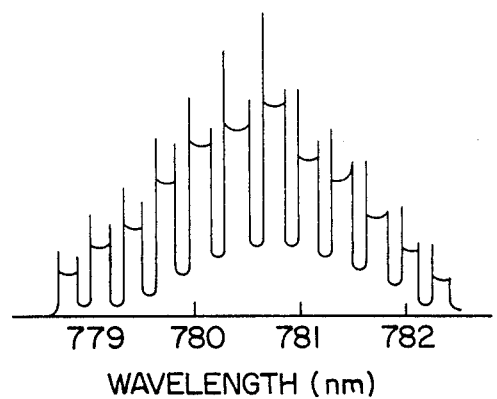
WAVELENGTH (nm)
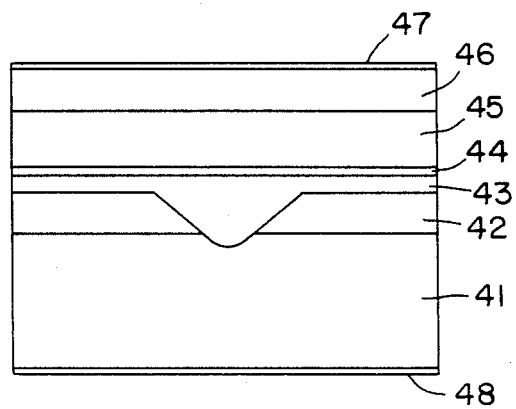
FIG. 4
PRIOR ART

SEMICONDUCTOR LASER DEVICE

BACKGROUND OF THE INVENTION

1. Field of the invention:

This invention relates to a semiconductor laser device which attains laser oscillation in a stabilized fundamental transverse mode at an extremely low threshold current level.

2. Description of the prior art:

As an example of semiconductor laser devices which oscillate a laser beam at a low threshold current level, there is a buried heterostructure (BH) semiconductor laser device, in which a laser-oscillating active layer is buried with burying layers having a lower refractive index than that of the active layer. The BH semiconductor laser device oscillates a laser beam according to an index waveguiding operation and has a low threshold current of 20 mA or less.

However, the BH semiconductor laser device has the disadvantage of oscillating a laser beam in an unstabilized transverse mode because the burying layers cannot be grown outside the active layer in a striped shape under stable conditions. Moreover, when coupled to an optical system such as an optical fiber, the BH semiconductor laser device has a tendency to produce excess noise because of its high sensitivity with respect to feeble light reflected from an optical system coupled thereto. Thus, the BH semiconductor laser device cannot be used as a replaying light source for compact disk players, which is required to have excellent low-noise characteristics, nor as a replaying light source for video disk players, which is required to have still more excellent low-noise characteristics than those of a replaying light source for the compact disk players.

In contrast to such a BH semiconductor laser device, a V-channeled substrate inner stripe (VSIS) semiconductor laser device has been proposed, in which light absorbing areas are disposed on both sides of a striped index-guiding waveguide. (See, e.g., Appl. Phys. Lett. 40 p. 372 (1982).) FIG. 4 shows a conventional VSIS semiconductor laser device comprising an n-GaAs current blocking layer 42 formed on a p-GaAs substrate 41. On the center portion of the n-GaAs current blocking layer 42, a V-striped channel is formed in the GaAs substrate 41 through the n-GaAs current blocking layer 42, and a p-GaAlAs cladding layer 43 is disposed on the n-GaAs current blocking layer 42 including the V-striped channel. The upper face of the p-GaAlAs cladding layer 43 is flat, on which a p-GaAlAs active layer 44, an n-GaAlAs cladding layer 45, and an n-GaAs cap layer 46 are successively formed. On the upper face of the n-GaAs cap layer 46 and the back face of the p-GaAs substrate 41, an n-sided electrode 47 and a p-sided electrode 48 are disposed, respectively.

Such a VSIS semiconductor laser device has an advantage that crystal layers can be readily grown on the substrate by liquid phase epitaxy. Although the threshold current of this VSIS semiconductor laser device is about 40 mA, which is extremely higher than that of the BH semiconductor laser device, the VSIS semiconductor laser device is suitable for use as a light source for compact disk players because undesirable noise resulting from reflected light from an optical system coupled thereto can be suppressed.

When the VSIS semiconductor laser device is used as a light source for video disk players which is required to have still more excellent low-noise characteristics than those of a light source for compact disk players, the thicknesses of the cladding layer and the active layer are controlled to produce a self-pulsation phenomenon which occurs by the interaction between the carriers and the laser light in the active layer. The self-pulsation provides a shorter coherence length of the laser beam, so that the sensitivity with respect to reflected light from an optical system can be reduced, thereby attaining excellent low-noise characteristics. However, because the VSIS semiconductor laser device is usually produced by liquid phase epitaxy, the thicknesses of the cladding layer and the active layer cannot be readily controlled. In liquid phase epitaxy, an error rate of about ±10% is unavoidable in the thickness of crystal layers grown. Therefore, when the VSIS semiconductor laser device is produced by liquid phase epitaxy, a production yield of self-pulsation semiconductor laser devices is decreased.

In recent years, as a method by which crystal layers can be grown to have a substantially uniform thickness, a molecular beam epitaxy (MBE) method and a metal-organic vapor phase epitaxy (MOVPE) method have been developed. However, when such an MBE or MOVPE method is used, because a crystal layer is grown to have a substantially uniform thickness over the surface of an underlying layer, it is difficult to grow the crystal layer on a current blocking layer 42 having a V-shaped channel formed therein so that the crystal layer fills in the V-shaped channel and the upper face of the crystal layer becomes flat, as in the VSIS semiconductor laser device. For this reason, with the use of the MBE or MOVPE method, the cladding layer and the active layer cannot be grown with their thicknesses controlled, to produce a self-pulsation phenomenon in the VSIS semiconductor laser device.

SUMMARY OF THE INVENTION

The semiconductor laser device of this invention, which overcomes the above-discussed and numerous other disadvantages and deficiencies of the prior art, comprises a semiconductor substrate, a striped mesa disposed on said substrate and having an active layer for laser oscillation, a current injection layer disposed on said striped mesa and having a width smaller than that of said striped mesa, and a burying layer disposed on both sides of said current injection layer so as to come into contact with the side walls of said current injection layer, said burying layer being capable of absorbing laser light produced in said active layer and of preventing current from flowing through the outside of said striped mesa.

In a preferred embodiment, the striped mesa is composed of a double heterostructure or a quantum well structure.

In a preferred embodiment, the abovementioned semiconductor laser device further comprises a multi-layered crystal disposed on both sides of said striped mesa, said multi-layered crystal including a plurality of burying layers.

In a preferred embodiment, the semiconductor layers constituting said striped mesa are grown by molecular beam epitaxy or metal-organic vapor phase epitaxy, and said multi-layered crystal is grown by liquid phase epitaxy.

Thus, the invention described herein makes possible the objectives of (1) providing a semiconductor laser device which has the device construction mentioned above, so that it can oscillate a laser beam in a stabilized fundamental transverse mode up to high optical output power at an extremely low threshold current level; (2) providing a semiconductor laser device which attains multi-longitudinal mode oscillation with wide line widths due to self-pulsation, so that the sensitivity with respect to reflected light from an optical system coupled thereto can be considerably reduced; (3) providing a semiconductor laser device with excellent low-noise characteristics which can be suitable for use as a replaying light source for compact disk players, video disk players, and the like; and (4) providing a semiconductor laser device which has the device construction mentioned above, so that it can be readily produced by a combination of molecular beam epitaxy or metal-organic vapor phase epitaxy, by which crystal layers can be grown to have a substantially uniform thickness, and liquid phase epitaxy, by which crystal layers can be grown to fill in concave portions.

BRIEF DESCRIPTION OF THE DRAWINGS

This invention may be better understood and its numerous objects and advantages will become apparent to those skilled in the art by reference to the accompanying drawings as follows:

FIG. 3 is a characteristic curve showing an oscillation spectrum of the semiconductor laser device of FIG. 1.

FIG. 4 is a sectional view showing a conventional VSIS semiconductor laser device.

DESCRIPTION OF THE PREFERRED EMBODIMENTS

EXAMPLES

Figure 1:
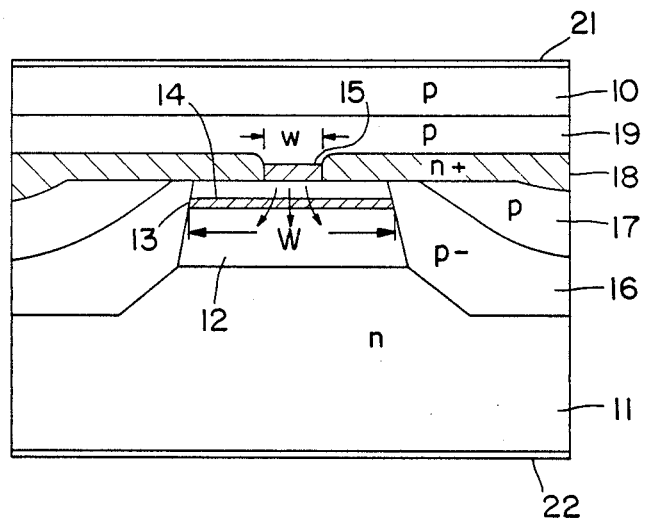
FIG. 1 is a sectional view showing a semiconductor laser device of this invention.

FIG. 1 shows a semiconductor laser device of this invention, which comprises an n-GaAs substrate 11 having a striped projecting portion in the shape of a mesa on the center thereof. On the striped projecting portion of the n-GaAs substrate 11, an n-$Ga_{1-y}Al_yAs$ cladding layer 12, a $Ga_{1-x}Al_xAs$ active layer 13, and a p-$Ga_{1-y}Al_yAs$ cladding layer 14 (where y>x) are successively grown to form a striped mesa. On the center of the p-$Ga_{1-y}Al_yAs$ cladding layer 14, a p-$Ga_{1-z}Al_zAs$ current injection layer 15 (where z>y) is formed into a striped shape. The width w of the p-$Ga_{1-z}Al_zAs$ current injection layer 15 is smaller than the width w of tha p-$Ga_{1-y}Al_yAs$ cladding layer 14.

On both sides of the mesa-shaped projecting portion in the center of the n-GaAs substrate 11, a p$^-$-GaAlAs high-resistivity first burying layer 16 is formed to bury the projecting portion of the n-GaAs substrate 11, the n-$Ga_{1-y}Al_yAs$ cladding layer 12, the $Ga_{1-x}Al_xAs$ active layer 13, and the p-$Ga_{1-y}Al_yAs$ cladding layer 14. The p$^-$-GaAlAs high-resistivity first burying layer 16 has a gentle slope toward the periphery of the n-GaAs substrate 11. On the p$^-$-GaAlAs high-resistivity first burying layer 16, a p-GaAs second burying layer 17 is formed so that the upper face of the p-GaAs second burying layer 17 is positioned at the same level as that of the upper face of the p-$Ga_{1-y}Al_yAs$ cladding layer 14.

On the p-$Ga_{1-y}Al_yAs$ cladding layer 14, the p$^-$-GaAlAs high-resistivity first burying layer 16, and the p-GaAs second burying layer 17, an n$^+$-GaAs third burying layer 18 is formed to bury the p-$Ga_{1-z}Al_zAs$ current injection layer 15. The upper face of the n$^+$-GaAs third burying layer 18 is flat and positioned at a higher level than that of the upper face of the p-$Ga_{1-z}Al_zAs$ current injection layer 15. The third burying layer 18 can absorb laser light produced in the active layer 13 and can also prevent current from flowing through the outside of the striped mesa.

On the n$^+$-GaAs third burying layer 18 and the p-$Ga_{1-z}Al_zAs$ current injection layer 15, a p-$Ga_{1-k}Al_kAs$ fourth burying layer 19 (where k>z) is formed to have a flat upper face, and on the p-$Ga_{1-k}Al_kAs$ fourth burying layer 19, a p-GaAs contact layer 10 is formed.

On the upper face of the p-GaAs contact layer 10 and the back face of the n-GaAs substrate 11, a p-sided electrode 21 and an n-sided electrode 22 are disposed, respectively.

In such a semiconductor laser device of this invention, the current injection layer 15 is formed into a striped shape on the center of the p-type cladding layer 14 in a self-alignment manner, with the fourth burying layer 18 disposed on both sides of the current injection layer 15. Therefore, the width w of the current injection layer 15 is quite small. Moreover, the current injection layer 15 is disposed above the active layer 13 with only the p-type cladding layer 14 interposed therebetween. Therefore, current injected from the current injection layer 15, which is interposed between the two separated portions of the fourth burying layer 18 for preventing a current flow, spreads only slightly in the lateral direction within the p-type cladding layer 14, resulting in a decrease in the threshold current. A portion of laser light produced in the active layer 13 leaks into the cladding layers 12 and 14 which interpose the active layer 13 therebetween. On both sides of the current injection layer 15, the leaked laser light is absorbed into the third burying layer 18 formed on the p-type cladding layer 14 because the p-type cladding layer 14 is thin. However, the Al mole fraction z of the p-$Ga_{1-z}Al_zAs$ current injection layer 15 is greater than the Al mole fraction y of the p-$Ga_{1-y}Al_yAs$ cladding layer 14, so that the leaked laser light cannot be absorbed into the current injection layer 15 For these reasons, within the active layer 13, an optical waveguide is formed on the basis of a difference in effective refractive index. The optical waveguide is formed with the current injection layer 15 and the third burying layer 18, so that the first burying layer 16 and the second burying layer 17 disposed on both sides of the active layer 13 do not relate to the formation of the optical waveguide. The first burying layer 16 and the second burying layer 17 not only prevent the diffusion of carriers in the active layer 13, but also prevent current from flowing through the outside of the striped mesa.

As described above, the semiconductor laser device of this invention has an extremely low threshold current level and oscillates a laser beam in a stabilized fundamental transverse mode up to high optical output power because of the light absorbing layers disposed on both sides of the optical waveguide. Therefore, the semiconductor laser device of this invention is most suitable for use as a light source for compact disk players, video disk players, and the like.

The self-pulsation, in which pulsed laser oscillation occurs continuously by the interaction between the carriers and the laser light in the active layer, will be caused under the conditions that the effective refractive index is small, the width of the oscillation spot is large, and the width of the current injection region is smaller than that of the oscillation spot. In the semiconductor laser device of this invention, the active layer 13 and the p-type cladding layer 14 are grown to have a thickness suitable for the reduction of the effective refractive index, and the width w of the current injection layer 15 (i.e., the width of the current injection region) is set as small as possible, which leads to self-pulsation of the semiconductor laser device. When the semiconductor laser device provides a self-pulsation phenomenon, multi-longitudinal mode oscillation with wide line widths can be obtained, so that the coherence length of the laser beam emitted becomes short, and therefore, the sensitivity with respect to reflected light from an optical system coupled thereto is reduced, resulting in an improvement of the low-noise characteristics. In the semiconductor laser device of this invention, the active layer 13 and the cladding layer 14 can be grown to have a substantially uniform thickness by molecular beam epitaxy or by metal organic vapor phase epitaxy.

A method for the production of a semiconductor laser device of this invention will hereinafter be explained by reference to FIGS. 2a to 2d.

Figure 2B:
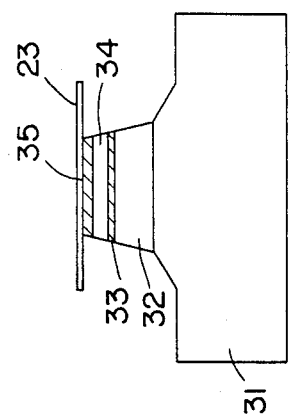
FIGS. 2a to 2d are schematic diagrams showing a process for the production of the semiconductor laser device of FIG. 1.
Figure 2D:
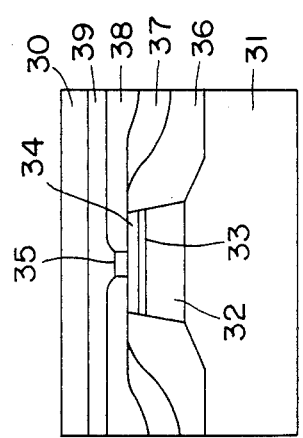
Figure 2A:
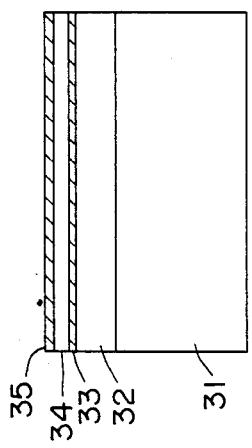

First, as shown in FIG. 2a, on an n-GaAs substrate 31 (the diameter thereof being, for example, 2 inches), an n-$Ga_{0.55}Al_{0.45}As$ cladding layer 32 (the thickness thereof being 1 $\mu$m), a $Ga_{0.87}Al_{0.13}As$ active layer 33 (the thickness thereof being 0.11 $\mu$m), a p-$Ga_{0.55}Al_{0.45}As$ cladding layer 34 (the thickness thereof being 0.23 $\mu$m, and a $Ga_{0.4}Al_{0.6}As$ current injection layer 35 (the thickness thereof being 0.15 $\mu$m) were successively grown by molecular beam epitaxy. These epitaxially grown layers had only an error of ±2% in the respective thicknesses relative to the predetermined values, indicating the excellent uniformity of layer thickness.

Then, a resist (e.g., Az-1350) was applied to the entire upper face of the current injection layer 35 to form a resist layer 23, and then the current injection layer 35, the cladding layer 34, the active layer 33, and the cladding layer 32 were etched by a photolithographic technique with the use of an etchant containing sulfuric acid so that the striped area with a width of 10 $\mu$m remained on the substrate 31, resulting in a mesa-shaped projecting portion and a striped mesa composed of the semiconductor layers on the center of the substrate 31 as shown in FIG. 2b.

Figure 2C:
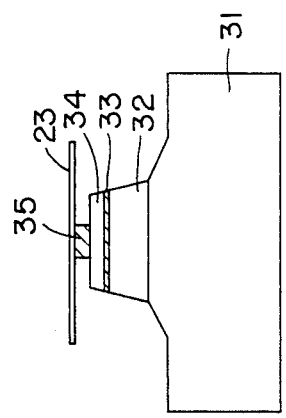

Then, the resulting multi-layer structure formed on the substrate 31 was immersed in hydrofluoric acid, and thereby only the $Ga_{0.4}Al_{0.6}As$ current injection layer 35 with a high Al mole fraction of 0.6 was etched from both sides thereof, so that the width of the striped $Ga_{0.4}Al_{0.6}As$ current injection layer 35 thus treated is 2 $\mu$m as shown in FIG. 2c. After the removal of the resist layer 23, as shown in FIG. 2d, a p$^-$-$Ga_{0.4}Al_{0.6}As$ high-resistivity first burying layer 36 was grown to reach the upper face of the p-$Ga_{0.55}Al_{0.45}As$ cladding layer 34 by liquid phase epitaxy, and on the high-resistivity first burying layer 36, a p-GaAs second burying layer 37 and an n$^+$-GaAs third burying layer 38 were successively grown by liquid phase epitaxy. At that time, the second burying layer 37 was not grown on the upper face of the p-$Ga_{0.55}Al_{0.45}As$ cladding layer 34, but only the third burying layer 38 was grown on the cladding layer 34. However, the $Ga_{0.4}Al_{0.6}As$ current injection layer 35 formed on the p-$Ga_{0.55}Al_{0.45}As$ cladding layer 34 had a greater Al mole fraction than that of the cladding layer 34, so that the third burying layer 38 was not grown on the upper face of the current injection layer 35 but was grown sufficiently to have a thickness of about 0.5 $\mu$m.

Thereafter, on the third burying layer 38 and the current injection layer 35, a p-$Ga_{0.3}Al_{0.7}As$ fourth burying layer 39 was grown by liquid phase epitaxy. The fourth burying layer 39 had a sufficiently greater Al mole fraction than that of the $Ga_{0.4}Al_{0.6}As$ current injection layer 35, so that sufficient growth period allowed the growth of the fourth burying layer 39 on the current injection layer 35. The reason for this is that in liquid phase epitaxy, more reactive Al contained in a melt of Ga may attack an oxide film formed on the surface of a GaAlAs layer, resulting in an excellent wettability of the GaAlAs layer by the melt of Ga.

In this way, the fourth burying layer 39 was grown on the upper face of the third burying 38 and the current injection layer 35, after which a p-GaAs contact layer 30 was grown on the fourth burying layer 39 to have a thickness of about 5 $\mu$m.

Then, the back face of the substrate 31 was polished to adjust the thickness of the wafer to about 150 $\mu$m. The upper face of the p-GaAs contact layer 30 and the back face of the substrate 31 were then subjected to a vapor deposition treatment with metal materials of Au-Zn and Au-Ge, respectively, and subjected to a heat treatment to form a p-sided electrode of an alloy of Au-Zn and an n-sided electrode of an alloy of Au-Ge, respectively, followed by cleaving and scribing to form a laser device unit having an internal cavity length of about 250 $\mu$m.

The resulting semiconductor laser device oscillated a laser beam of a wavelength of 780 nm at a threshold current of 20 mA. The oscillation spectrum obtained at that time is shown in FIG. 3. As can be seen from this figure, the semiconductor laser device of this example attains multi-longitudinal mode oscillation due to self-pulsation, so that the intensity of noise resulting from reflected light can be considerably decreased. The semiconductor laser device with such low-noise characteristics can be readily produced at a 90% yield.

Although the above-mentioned example only discloses a semiconductor laser device with a double heterostructure, this invention is also applicable to a semiconductor laser device with a quantum well structure. The quantum well semiconductor laser device having light absorbing areas on both sides of the optical waveguide can also be readily produced by a combination of molecular beam epitaxy, by which crystal layers can be grown to have a substantially uniform thickness, and liquid phase epitaxy, by which crystal layers can be grown to fill in concave portions.

Moreover, the semiconductor laser device of this invention is not limited to the respective conductivity types of the semiconductor layers of the above-mentioned semiconductor laser device, but it is, of course, applicable to the opposite conductivity types thereto.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, an apparatus comprising:
   a semiconductor substrate;
   a striped mesa disposed on said substrate and successively having a first cladding layer, an active layer for laser oscillation, and a second cladding layer;
   a current injection layer disposed on said striped mesa;
   a multi-layered crystal disposed on both sides of said striped mesa, said multi-layered crystal including first and second burying layers; and
   a third burying layer disposed on both sides of said current injection layer so as to come into contact with the side walls of said current injection layer, said third burying layer being capable of absorbing laser light produced in said active layer and of preventing current from flowing through the outside of said striped mesa;
   wherein said current injection layer has a width smaller than that of said striped mesa.

2. An apparatus according to claim 1, wherein said striped mesa comprises a double heterostructure.

3. An apparatus according to claim 1, wherein the semiconductor layers constituting said striped mesa are grown by molecular 4. An apparatus according to claim 1, wherein said striped mesa comprises a quantum well structure.

* * * * *

UNITED STATES PATENT AND TRADEMARK OFFICE
CERTIFICATE OF CORRECTION

PATENT NO. : 4,984,244

DATED : 8 January 1991

INVENTOR(S) : Yamamoto et al.

It is certified that error appears in the above-identified patent and that said Letters Patent is hereby corrected as shown below:

In column 8, claim 3, a large part of the description is omitted. Please add the following phrase after "... by molecular".

beam epitaxy or metal-organic vapor
    phase epitaxy, and said multi-layered
    crystal is grown by liquid phase epitaxy.

Signed and Sealed this

Seventeenth Day of August, 1993

*Attest:*

BRUCE LEHMAN

*Attesting Officer*     Commissioner of Patents and Trademarks